US006656370B1

(12) United States Patent
Toscano et al.

(10) Patent No.: US 6,656,370 B1
(45) Date of Patent: Dec. 2, 2003

(54) METHOD FOR THE MANUFACTURE OF PRINTED CIRCUIT BOARDS

(76) Inventors: Lenora Toscano, 29 Preston Ter., Apt. 9, Waterbury, CT (US) 06705; Raymond Letize, 47 Linwood St., West Haven, CT (US) 06516

( * ) Notice: Subject to any disclaimer, the term of this patent is extended or adjusted under 35 U.S.C. 154(b) by 270 days.

(21) Appl. No.: 09/687,880

(22) Filed: Oct. 13, 2000

(51) Int. Cl.⁷ .................... H01B 13/00; C23F 1/00; B44C 1/22
(52) U.S. Cl. .................... 216/13; 216/100; 216/105; 174/257; 252/79.5
(58) Field of Search .................... 216/13, 105, 100; 174/257; 252/79.5

(56) References Cited

U.S. PATENT DOCUMENTS

| | | | | |
|---|---|---|---|---|
| 3,231,503 A | * | 1/1966 | Lau ........................... | 216/100 |
| 3,466,208 A | * | 9/1969 | Slominski ................... | 216/105 |
| 4,265,722 A | * | 5/1981 | Faul et al. ................ | 204/129.6 |
| 4,311,551 A | * | 1/1982 | Sykes ......................... | 216/105 |
| 4,319,955 A | * | 3/1982 | Murski ....................... | 216/107 |
| 4,940,181 A | | 7/1990 | Juskey, Jr. et al. ....... | 228/180.2 |
| 5,235,139 A | | 8/1993 | Bengston et al. .......... | 174/257 |
| 5,935,640 A | | 8/1999 | Ferrier et al. ................. | 427/98 |
| 5,955,141 A | * | 9/1999 | Soutar et al. ............... | 427/125 |
| 6,168,854 B1 | * | 1/2001 | Gibbs .......................... | 174/250 |

* cited by examiner

Primary Examiner—Nadine G. Norton
Assistant Examiner—Shamim Ahmed
(74) Attorney, Agent, or Firm—Carmody & Torrance LLP

(57) ABSTRACT

A process for the manufacture of printed circuit boards is disclosed wherein a plated silver deposit is used both as an etch resist and as a final finish for enhancing the solderability of the copper circuits. An aqueous alkaline etchant which is free of halide ions is proposed as being particularly compatible with the silver etch resist/final finish.

21 Claims, No Drawings

METHOD FOR THE MANUFACTURE OF PRINTED CIRCUIT BOARDS

FIELD OF INVENTION

The present invention relates to a process for the manufacture of double-sided and multilayer printed circuit boards and compositions useful in that process. The process contemplates the use of an immersion or electroless silver deposit which serves both as an etch resist and as a final finish solderability preservative. The process also contemplates the use of a specific type of alkaline etchant, which is particularly compatible with the immersion or electroless silver deposit. The proposed process is particularly versatile in reducing the number of steps, variety of chemicals, and waste necessary to produce these circuit boards.

BACKGROUND OF INVENTION

In the manufacture of printed circuit boards, it is now commonplace to produce printed circuitry on one or both sides of a planar rigid or flexible insulating substrate. The manufacture of multi-layer printed circuits, which consist of parallel, planar, alternating inner layers of insulating substrate material and conductive metal is of increased importance. The exposed outer sides of the laminated structure are provided with circuit patterns and any inner layers themselves may contain circuit patterns.

In terms of providing the desired circuit pattern on the board, and any inner layers, the art has developed a variety of manufacturing sequences, many of which fall into the broad categories of subtractive or additive techniques. Common to the subtractive processes is the need to etch away (or subtract) metal to expose the desired circuit patterns.

When utilizing a subtractive technique to form circuit patterns the starting material is typically a copper clad laminate or a multilayer circuit board with copper foil clad to the outer surfaces thereof. In either case, the copper cladding must be imaged in the form of the desired circuit patterns. One method of forming the desired image is to apply a plating mask in the negative (or opposite) image of the desired circuitry pattern. The plating masks used in this regard are typically photo-polymer materials. Once the plating mask is applied in the negative image of the desired circuitry pattern, a metal etch resist is plated onto the exposed copper surfaces (i.e. in the positive image of the desired circuitry pattern) and the plating resist is stripped away. The result is copper cladding with a metal etch resist plated upon it in the pattern of the desired circuitry with the metal etch resist covering select areas of the copper cladding in the image of the desired circuitry and exposed areas of copper cladding in the negative image of the desired circuitry. Typically, metal etch resist materials include tin and tin/lead alloys. The copper clad laminate (or multilayer board) with the metal etch resist on it is then contacted with a copper etchant such that all of the exposed copper surfaces are etched away leaving behind the metal etch resist covered circuitry which are revealed in relief. Upon creation of the circuit pattern as noted above, the etch resist is stripped away revealing the desired copper circuit patterns.

After formation of the circuitry pattern, the printed circuit fabricator is required to arrange that portions of the circuitry generally including through-holes, pads, lands and other points of connection, are receptive to subsequent soldering processes. Soldering is used to electrically and physically connect electronic components and leads to the through-holes, surrounding pads, lands and other points of connection (collectively, "areas of connection"). Thus these areas of connection must be readily wettable by the solder and permit an integral conductive connection with the leads or surfaces of the electronic components. Because of these needs, printed circuit fabricators have devised various methods of preserving and enhancing the solderability of these areas of connection.

One method of arranging good solderability of these surfaces is to plate them with a final finish coating of a precious metal such as gold, palladium, or silver. U.S. Pat. No. 5,235,139 (Bengston, et al.), the teachings of which are incorporated herein by reference, proposes a final finish consisting of a plated layer of nickel followed by a precious metal coating such as gold. In this regard reference is also made to U.S. Pat. No. 4,940,181 (Juskey, Jr. et al.), the teachings of which are incorporated herein by reference in their entirety, were a final finish consists of copper plate followed by nickel followed by gold.

Another method of preserving the solderability of these areas of connection is described in U.S. Pat. No. 5,935,640 (Ferrier, et al.), the teaching of which are incorporated herein by reference in their entirety. Ferrier, et al. proposes a process for preserving and enhancing the solderability of a surface through use of immersion silver deposits. The silver deposits are used alone or in combination with a second deposit of a more noble metal upon the immersion silver deposit.

The invention herein have now found a way to combine the etch resist and the final finish while using a novel copper etchant which is particularly compatible with the combined etch resist/final finish. In doing so, the proposed process and related compositions are particularly versatile in reducing the number of steps, variety of chemicals and waste necessary in producing printed circuit boards.

SUMMARY OF INVENTION

The current invention proposes the use of one immersion silver deposit to serve as both the etch resist and the final finish solderability preservative. The immersion silver dual etch resist/final finish is used in conjunction with a copper etchant which is particularly compatible with the silver material. The proposed copper etchant is a chloride (halide) free alkaline copper etchant preferably in an ammonium hydroxide matrix.

The process proposed is a versatile, efficient, low cost method for effectively combining the etch resist material with the final finish material. The process reduces the number of steps, the variety of chemicals and the costs involved in producing printed circuit boards.

DETAILED DESCRIPTION OF THE INVENTION

It has been discovered that immersion (or electroless) silver deposits are capable of acting as etch resist materials while also providing the function of a final finish solderability preservative, particularly when used in conjunction with an alkaline ammonium hydroxide based, chloride free, copper etchant.

Thus the invention proposes a sequential process for forming printed circuit boards comprising:

1. apply a plating mask to the outer copper surfaces of a copper clad laminate, or a multilayer printed circuit board, such that the plating mask covers only portions of the copper surfaces in the negative image of the circuitry pattern desired, thereby yielding exposed copper surfaces in the positive image of the desired circuitry pattern and plating mask covered copper surfaces in the negative image of the desired circuitry pattern;

2. plating a silver deposit onto the exposed copper surfaces in the positive image of the desired circuitry pattern;
3. stripping the plating mask;
4. contacting the copper clad laminate (or multilayer printed circuit board) with an etchant for copper which is substantially free of chloride and other halide ions and preferably comprises ammonium hydroxide such that the exposed copper areas are etched away leaving the silver coated copper circuitry pattern in relief;
5. optionally, but preferably cleaning the silver surfaces.

As noted, the process of this invention may be utilized in the manufacture of single sided, double sided and/or multilayer printed circuit boards. In the case of single sided printed circuit boards the starting material is a plastic, or paper impregnated with plastic, non-conducting substrate which is clad on one side with copper foil. In the case of a double-sided printed circuit board the non-conducting substrate is clad on both sides with copper foil. In the case of a multilayer printed circuit board, the starting material is a multilayer package of innerlayers which is ultimately clad on the outer surfaces with copper foil. In this specification and in the claims, the single sided and double-sided copper clad laminates as well as the copper clad multilayer packages will be referred to collectively as copper clad laminate.

The plating mask used to create the negative image of the desired circuitry pattern on the copper surfaces of the copper clad laminates are generally polymeric materials or photopolymeric materials which are capable of adhering to the copper surfaces and remaining in tact during the plating process. In the case of a standard polymeric plating mask, the mask is stenciled onto the copper clad laminate in the negative image of the desired circuitry and then cured. In the case of a photopolymer-plating mask, the photopolymer is applied over essentially the entire copper surface, photo imaged, and developed into the negative image of the desired circuitry pattern. In either case the result is a copper clad laminate, partially covered with the plating resist, such that areas of the copper clad laminate corresponding to the negative image of the desired circuitry are covered with the plating mask and substantially all other areas of the copper clad laminate are exposed copper surfaces corresponding to the desired circuitry.

The exposed copper surfaces are then plated with silver using a silver-plating solution. Typical silver plating solutions useful in practicing this invention are described in U.S. Pat. No. 5,935,640 (Ferrier, et al.), the teachings of which are incorporated herein by reference in their entirety. Ferrier, et al. describes a silver-plating solution comprising (i) a soluble source of silver ions, (ii) an acid, (iii) an imidazole and (iv) optionally, an oxidant. Silver-plating solutions of this type described by Ferrier, .et al. have proved to be particularly useful in practicing the process of this invention. However, many silver-plating solutions will suffice. In order for a silver-plating solution to be effective in practicing the process of this invention, it should produce an adherent dense deposit of silver on the copper surfaces. The silver deposit should be thick enough (i.e. from 0.20 to 0.63 microns) and should uniformly and completely cover the copper surfaces without any pinholes or other areas of non-coverage. Thus the silver should be chemically and physically resistant to the subsequent etchant.

After silver-plating the plating mask is stripped away. Generally, the plating mask will be stripped in a strongly alkaline aqueous solution which solution may also contain organic solvents and corrosion inhibitors. Stripping the plating mask will reveal exposed copper surfaces. Thus at this point the surfaces of the copper clad laminate are comprised of areas of copper plated with silver thereon in the positive image of the desired circuit pattern and exposed copper areas in the negative image of the desired circuit pattern.

The copper clad laminate is next contacted with an etchant that is compatible with the silver etch resist. The inventors have found that an aqueous alkaline copper etchant, preferably one in an ammonium hydroxide matrix, substantially free of halide ions is suitable for use in the process of this invention. In particular an aqueous alkaline copper etchant, substantially free of halide ions, useful in the process of this invention can comprise:

| Component | |
| --- | --- |
| Ammonium bicarbonate | 22.3 Wt. % |
| Ammonium hydroxide (28%) | 35.2 Wt. % |
| Copper Oxide | 40 g/l |

The foregoing etchant has been found to perform particularly well in the process of this invention. It is most advantageous to contact the copper clad laminate with the etchant by spraying the etchant onto the surfaces of the copper clad laminate.

After contacting the copper clad laminate with the etchant, the silver plated surfaces are optionally but preferably cleaned. Preferably the cleaner will be capable of removing tarnish and any other residues from the silver surfaces. If used, a particularly preferred cleaner is Sterling Pre-Assembly Cleaner available from MacDermid, Incorporated, 245 Freight Street, Waterbury, Conn. 06702.

The process of the invention disclosed herein is illustrated in the following example which should not be taken as limiting in any way:

EXAMPLE I

Dry film plating resist was applied to the copper surfaces of a copper clad aminate. Portions of the plating resist were then selectively exposed to actinic radiation in the negative image of the desired circuitry pattern. The copper clad laminate was then contacted via spray with a mildly alkaline solution of potassium carbonate such that the areas of the plating resist that were not contacted with actinic radiation were dissolved away revealing the underlying, now exposed, copper surfaces in the positive image of the desired circuit pattern. The exposed copper surfaces were then cleaned using a mildly alkaline cleaner and micro-etched using a hydrogen peroxide/sulfuric acid micro-etchant. The foregoing cleaning and micro etching were performed in order to remove any remaining plating resist residues and to ensure that the subsequent silver-plating solution will plate uniformly and completely over the copper surfaces .

The copper clad laminate was then contacted with a silver-plating solution comprising:

| Component | |
| --- | --- |
| silver nitrate | 1 g/l |
| methane sulfonic acid (70%) | 20 ml/l |

-continued

| Component | |
|---|---|
| 3,5 dinitrohydroxy benzoic acid | 1 g/l |
| 1-histidine | 1 g/l |
| water | balances | at 100° for 5 minutes such that approximately 25 microinches of silver were plated onto the copper surfaces.

The plating mask was then stripped from the surfaces of the copper clad laminate sing a highly alkaline solution of sodium hydroxide.

Next the copper clad laminate was sprayed with an alkaline etchant solution comprising:

| Component | |
|---|---|
| Ammonium bicarbonate | 22.3 Wt. % |
| Ammonium hydroxide | 35.2 Wt. % |
| Copper oxide | 40 g/l | at 130° F. for 5 minutes such that all of the exposed copper surfaces were etched away leaving the silver plated copper surfaces to stand out in relief in the positive image of the desired circuitry. Note that between each chemical processing step in this process, and after the final step, the laminate was rinsed in deionized water.

The silver surfaces were then tested for solderability by immersion in molten solder and checking to see that all of the silver surfaces were uniformly coated with solder. All of the silver surfaces were uniformly coated with solder indicating complete solderability.

What is claimed is:

1. A process for manufacture of a printed circuit board, comprising circuits arranged in a positive image of a desired circuit pattern, said process comprising:
   a. plating a silver deposit onto a portion of a surface of a copper clad laminate in the positive image of the circuits thereby creating silver plated copper areas and exposed copper areas;
   b. contacting the copper clad laminate with an aqueous etchant for copper, which etchant is substantially free of halide ions, such that the exposed copper areas are dissolved; and
   c. soldering directly to at least portions of the silver deposit;
      wherein the silver deposit acts to substantially prevent the etchant from dissolving the copper in the silver-plated copper areas.

2. A process according to claim 1, wherein the etchant comprises ammonium bicarbonate, ammonium hydroxide and copper.

3. A process according to claim 1, wherein the silver deposit is cleaned after step (b) but before step (c).

4. A process according to claim 1, wherein the silver deposit is plated using a silver plating solution comprising at least one material selected from the group consisting of imidazoles and nitro aromatic compounds.

5. A process according to claim 4, wherein the etchant comprises ammonium bicarbonate, ammonium hydroxide and copper.

6. A process according to claim 4, wherein the silver deposit is cleaned after step (b) but before step (c).

7. A process according to claim 5, wherein the silver deposit is cleaned after step (b) but before step (c).

8. A process for the manufacture of a printed circuit board, comprising circuits arranged in a negative image of a desired circuit pattern, said process comprising:
   a. applying a plating mask to an outer surface of copper clad laminate such that the plating mask covers only portions of said outer surface in the negative image of the circuits thereby creating exposed copper areas and plating mask covered copper areas;
   b. plating a silver deposit onto the exposed copper areas;
   c. stripping away the plating mask;
   d. contacting the copper clad laminate with an aqueous etchant for copper, which etchant is substantially free of halide ions; and
   e. soldering directly to at least portions of the silver deposit;
      wherein the silver deposit acts to substantially prevent the etchant from dissolving the copper beneath the silver deposit.

9. A process according to claim 8, wherein the etchant comprises ammonium bicarbonate, ammonium hydroxide, and copper.

10. A process according to claim 8, wherein the silver deposit is cleaned after step (b) but before step (c).

11. A process according to claim 8, wherein the silver deposit is plated using a silver plating solution comprising at least one material selected from the group consisting of imidazoles and nitro aromatic compounds.

12. A process according to claim 11, wherein the etchant comprises ammonium bicarbonate, ammonium hydroxide and copper.

13. A process according to claim 11, wherein the silver deposit is cleaned after step (b) but before step (c).

14. A process according to claim 12, wherein the silver deposit is cleaned after step (b) but before step (c).

15. A process for the manufacture of a printed circuit board, comprising circuits arranged in a positive image of a desired circuit pattern, said process comprising:
   a. platng a silver deposit onto a surface of a copper clad laminate in the positive image of the circuits thereby creating silver plated copper areas and exposed copper areas; and
   b. contacting the copper clad laminate with an aqueous etchant for copper, which etchant is substantially free of halide ions, such that the exposed copper areas are dissolved from the copper clad laminate;
      wherein the silver deposit acts to substantially prevent the etchant from dissolving the copper in the silver-plated copper areas.

16. A process according to claim 15, wherein the etchant comprises ammonium bicarbonate, ammonium hydroxide, and copper.

17. A process according to claim 15, wherein the silver deposit is plated using a silver plating solution comprising at least one material selected from the group consisting of imidazoles and nitro aromatic compounds.

18. A process according to claim 17, wherein the etchant comprises ammonium bicarbonate, ammonium hydroxide, and copper.

19. A process according to claim 1, wherein the etchant comprises:
   a. 22.3 weight percent ammonium bicarbonate;
   b. 35.2 weight percent ammonium hydroxide; and
   c. 40 grams/liter copper oxide.

20. A process according to claim 8, wherein the etchant comprises:

a. 22.3 weight percent ammonium bicarbonate;
b. 35.2 weight percent ammonium hydroxide; and
c. 40 grams/liter copper oxide.

21. A process according to claim 15, wherein the etchant comprises:

a. 22.3 weight percent ammonium bicarbonate;
b. 35.2 weight percent ammonium hydroxide; and
c. 40 grams/liter copper oxide.

* * * * *